United States Patent
Okawa et al.

(10) Patent No.: US 7,613,960 B2
(45) Date of Patent: Nov. 3, 2009

(54) SEMICONDUCTOR DEVICE TEST APPARATUS AND METHOD

(75) Inventors: Kazuyoshi Okawa, Tokyo (JP); Junko Ogino, Tokyo (JP); Masayuki Yoshinaga, Tokyo (JP); Hajime Honda, Tokyo (JP)

(73) Assignee: Advantest Corporation, Tokyo (JP)

( * ) Notice: Subject to any disclaimer, the term of this patent is extended or adjusted under 35 U.S.C. 154(b) by 246 days.

(21) Appl. No.: 10/588,636

(22) PCT Filed: Feb. 18, 2004

(86) PCT No.: PCT/JP2004/001805

§ 371 (c)(1),
(2), (4) Date: Aug. 4, 2006

(87) PCT Pub. No.: WO2005/078736

PCT Pub. Date: Aug. 25, 2005

(65) Prior Publication Data

US 2007/0265794 A1 Nov. 15, 2007

(51) Int. Cl.
*G11C 29/00* (2006.01)
(52) U.S. Cl. .............. 714/710; 714/718; 365/200; 365/201
(58) Field of Classification Search ............ 714/710; 365/200
See application file for complete search history.

(56) References Cited

U.S. PATENT DOCUMENTS

| 6,243,307 B1 | 6/2001 | Kawagoe |
| 6,345,004 B1 | 2/2002 | Omura et al. |
| 6,370,516 B1 * | 4/2002 | Reese ........................ 705/36 R |
| 6,459,292 B1 * | 10/2002 | Oikawa et al. .............. 324/765 |

FOREIGN PATENT DOCUMENTS

| JP | 03-102521 | 4/1991 |
| JP | 11-213695 | 8/1999 |
| JP | 11-338521 | 12/1999 |
| JP | 2000-195294 | 7/2000 |
| JP | 2002-216495 | 8/2002 |

OTHER PUBLICATIONS

Stallman R., translated by Toru Takizawa, "GNU Emacs 19 Manual", Addison Wesley Publishers Japan Kabushiki Kaisha, Oct. 31, 1997, pp. 337-338 (with its English translation).*

Stallman, R., translated by Toru Takizawa, "GNU Emacs 19 Manual", Addison Wesley Publishers Japan Kabushiki Kaisha, Oct. 31, 1997, pp. 337-338 (with its English translation).

* cited by examiner

*Primary Examiner*—Kevin L Ellis
*Assistant Examiner*—Daniel F McMahon
(74) *Attorney, Agent, or Firm*—David N. Lathrop

(57) ABSTRACT

There is provided a semiconductor test apparatus which uses a test processor to apply a test signal to a DUT having a semiconductor device within it to determine whether the memory is acceptable or not on the basis of a response signal, and uses a repair analysis computing unit to analyze the result of the test to determine how to replace a defective cell of the memory with a spare line. The repair analysis computing unit includes a fail memory which stores test results and a general-purpose repair analysis part which analyzes the test results in accordance with an MRA program and inserts and executes a user function of a user analysis program between units of analysis processing.

13 Claims, 10 Drawing Sheets

FIG. 5

```
1   #include <MraLib.h>

2   static   MraRepairId_t   RepairIdList[MraSPARELINE_COUNT_MAX];
3   static   int        compare( const void *a, const void *b)
4   {
5     const MraRepairId_t   *A = a, *B = b;
6     int       blockA, blockB;
7     uint32_t      adrsA, adrsB;
8     MraRepairGetAddress( *A, &blockA, &adrsA);
9     MraRepairGetAddress( *B, &blockB, &adrsB);
10    if (    adrsA  < adrsB)          return   -1;
11    if (    adrsA  > adrsB)          return    1;
12    return             0;
13  }

14  static  MraStatus_t addressCheckRow(int blockGroupNo, MraDir_t dir)
15  {
16    MraRepairId_t *repairId = RepairIdList;
17    int           blockNo0, blockNo1;
18    uint32_t      address0, address1;
19    int i, count;
20    count = MraBlockGroupGetRepairList ( blockGroupNo, dir,
21                                         repairId, MraSPARELINE_COUNT_MAX);
22    MraQsort( repairId,  count,  sizeof(MraRepairId_t), compare);
23    for (i=0 ; i<count-1;  i++) {
24      MraRepairGetAddress( repairId[ i  ], &blockNo0, &address0);
25      MraRepairGetAddress( repairId[ i+1], &blockNo1, &address1);
26      if ( address0 == address1) return MraNG;
27    }
28    return MraOK;
29  }

30  MraStatus_t  SampleRuleCheck1(void *clientdata)
31  {
32    int blockGroupNo ;
33    blockGroupNo = MraGetBlockGroupNo( );
34    if ( addressCheckRow ( blockGroupNo, MraDIR_ROW) ! = MraOK) return MraNG ;
35    return        MraOK ;
36  }

37  int       UserSetup ( void )
38  {
39    MraSetUserFunc("SAMPLE_RULE_CHECK1", MraPOINT_POST_REPAIR
          _LINEFAIL, SampleRuleCheck1,
40                    NULL );
41    MraSetUserFunc("SAMPLE_RULE_CHECK1", MraPOINT_POST_REPAIR
          _BITFAIL, SampleRuleCheck1,
42                    NULL);
43    return     0 ;
44  }
```

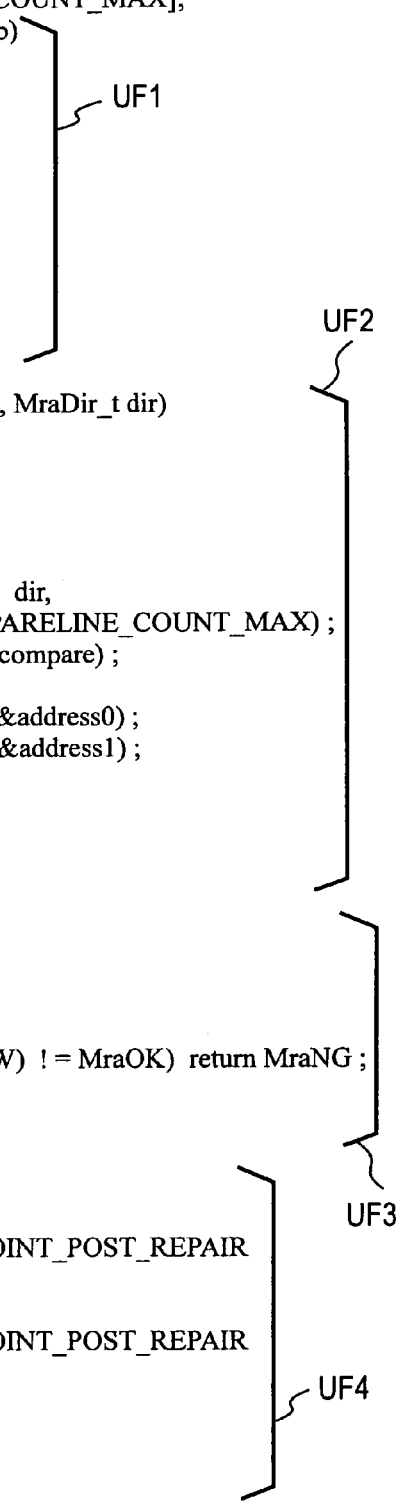

SEMICONDUCTOR DEVICE TEST APPARATUS AND METHOD

TECHNICAL FIELD

The present invention relates to a semiconductor device test apparatus and method which replaces defective memory cells of a memory of a semiconductor device with spare memory cells provided beforehand, thereby repairing the defective semiconductor device.

BACKGROUND ART

An apparatus for analyzing defective memory cells of a memory of semiconductor devices fabricated as integrated circuits to determine a way to efficiently repair the defective memory cells using spare memory cells is called the MRA (Memory Repair Analyzer). The semiconductor devices are not limited to dedicated memory devices; they may be any semiconductor devices containing memory devices. Semiconductor devices to which the present invention is applied will be hereinafter referred to as memory devices and a memory device to be tested will be referred to as a DUT (Device Under Test). There are a number of MRA approaches. One typical example will be described below.

FIG. 8A shows a wafer 110 on which a large number of semiconductor devices are formed in an array. MRA is performed in the stage preceding a memory test, that is, it is performed in an on-wafer stage. A large number of memory devices are formed in an array on the wafer 110. Each of the memory devices has multiple memory blocks, each consisting of many memory cells. As a memory block 120 is schematically shown in FIG. 8B, more than one spare lines 130, 135 are provided for each memory block 120 along the rows (in the X-axis direction) and the columns (in the Y-axis direction).

Here, suppose that a test on the memory block 120 revealed that memory cells 122, 125, and 127 are defective. The test result data can be analyzed using MRA to determine a repair solution. FIG. 8C shows a repair solution in which the column line 131 of a memory cell 122 is replaced with one of the column spare lines 130 and the row line 136 of memory cells 125 and 127 is replaced with one of the row spare lines 135 by the MRA. Such repair of defective cells of memory devices formed on a wafer is described in U.S. Pat. No. 6,345,004 and U.S. Pat. No. 6,243,307, for example.

The MRA is means capable of analyzing fast which spare line a defective memory cell found in a memory device can be replaced with to repair the defect, by using dedicated hardware and software. The MRA has been sufficiently effective for repairing conventional memory ICs.

Memory devices have made remarkable progress in recent years. With the advent of 64M-SDRAM, more and more memory devices have unique redundancy structures specified by users (LSI manufactures) and have become complicated. As a result, a problem has arisen that the result of MRA analysis must be adjusted through a post process (post process at an on-wafer stage) as will be described later. That is, the conventional MRA capabilities are used to obtain a repair solution and then an engineering work station (EWS) must be used in a post process to make adjustments to the solution.

However, because this method can adjust only one solution determined by the MRA, it has been impossible for a post process to determine whether there is a solution that makes a defect found to be unrepairable as a result of adjustments in the post process repairable. Consequently, the yields have been reduced. An example of a device that could not be repaired using conventional MRA because of a redundancy structure will be described below.

The memory device shown in FIG. 9 consists of four block groups BG1-BG4. Block groups BG1 and BG2 make up BANK-A and block groups BG3 and BG4 make up BANK-B. Each block group consists of four blocks. Two spare row lines 135 are provided in each bank for repairing two block groups at a time. Two column spare lines 130 are provided for each block. The following three conditions are required to assign spare lines for repair of a defective memory cell.

FIG. 10 illustrates a first condition. The two spare lines in each block can repair any defective cells in the same block group freely in principle, with some exceptions.

FIG. 11 illustrates a second condition. The second condition is an exception to the first condition. The spare line of the rightmost block BL4 in the same block group cannot repair defective cells in the leftmost block BL1. Similarly, the spare lines of the leftmost block BL1 cannot repair defective cells in the rightmost block BL4.

FIG. 12 illustrates a third condition. This condition is as follows. Consider two adjacent blocks in two adjacent block groups, for example block BL4 in block group BG3 and block BL5 in block group BG4, in the same bank. If fails at address "a" that have occurred in block BL4 are repaired with a spare line of block BL4, fails at the same address "a" in the adjacent block BL5 cannot be repaired with a spare line of block BL5. However, address "a" in block BL5 can be repaired with a spare line of adjacent block BL6.

The example shown in FIG. 9 is of a memory device having three constrains of a redundancy structure. There are many other memory devices having various structures. It has become impossible to repair all of the various types of memory devices with conventional MRA. For example, the conventional MRA can address the first and second conditions in the memory device in FIG. 9, but not the third condition.

As has been stated above, the first and second conditions in the memory device having the redundancy structure shown in FIG. 9 can be addressed with the conventional MRA. After the MRA is performed, a post process must be performed for checking the third condition on the EWS to adjust the result of the repair. In addition, since only one repair solution of the first and second conditions is obtained before the third condition is checked, an optimum solution cannot necessarily be obtained and, consequently, a reduction in the yield can result.

That is, for the example described above, the conventional MRA requires, as the conceptual diagram shown in FIG. 13, performing a function test on a DUT (step S140), performing memory repair analysis (MRA) by inputting data on the results of the test to obtain a repair solution under the restrictions of the first and second conditions (step S141), storing temporarily the repair solution (step S142), and making adjustments to the result and the third condition on the EWS (step S143) to obtain a final repair solution.

An object of the present invention is to provide a semiconductor device test apparatus and method capable of analyzing and repairing the first, second, and third conditions at a time using a general-purpose MRA.

DISCLOSURE OF THE INVENTION

A semiconductor device test apparatus according to the present invention includes:

a test processor which applies a test signal to a semiconductor device under test and obtains information about a defective memory cell from a response signal; and a repair analysis computing unit which performs repair analysis of the defective memory cell information to determine a way to repair the defective memory;

wherein the repair analysis computing unit comprises:

memory repair analysis means for performing repair analysis of the defective memory cell information in accordance with a memory repair analysis program and determining assignment of a spare line to the defective memory cell; and user function means for inserting a user function based on a user-specified user repair analysis program between desired units of processing of the memory repair analysis program to make a change to data processed by the memory repair analysis program.

A semiconductor device test method according to the present invention includes the steps of:

(a) performing a function test on a memory of a semiconductor device under test to obtain information about a defective memory cell;

(b) performing memory repair analysis of the defective memory cell information on a processing-unit-by-processing-unit basis to determine assignment of a spare line to the defective cell; and (c) inserting a user function based on a user-defined defective memory cell repair condition between desired processing units used at step (b) to make a change to data processed by the memory repair analysis program.

BRIEF DESCRIPTION OF THE DRAWINGS

FIG. 5 is a diagram showing an exemplary user analysis program;

BEST MODES FOR CARRYING OUT THE INVENTION

A mode for implementing present invention will be described with respect to embodiments thereof with reference to the accompanying drawings.

Figure 1:
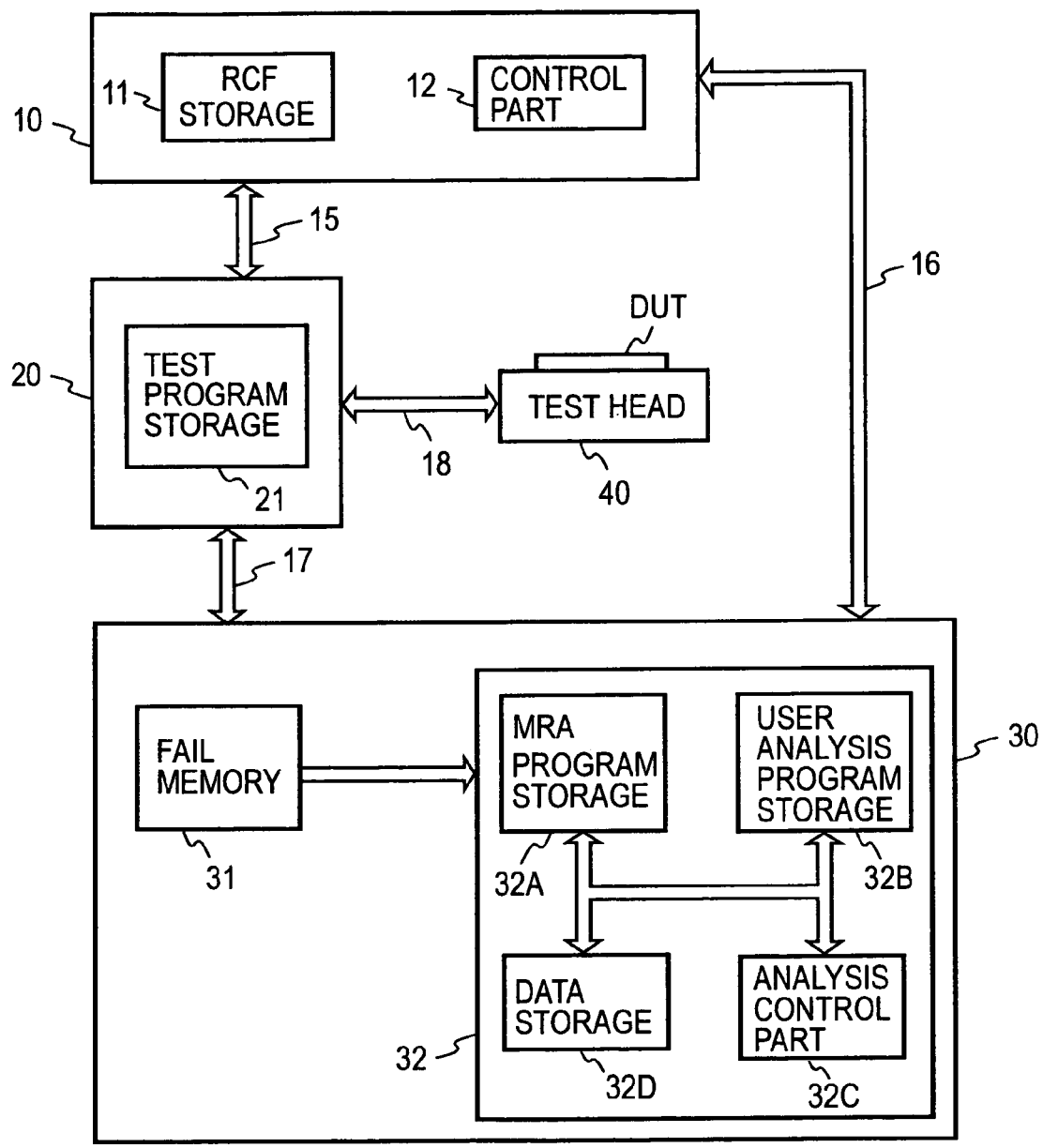
FIG. 1 is a conceptual block diagram of an embodiment of the present invention.

FIG. 1 shows a functional block diagram of an embodiment of the present invention. A semiconductor device test apparatus according to the present invention shown in FIG. 1 tests semiconductor devices having an memory in them (hereinafter simply referred to as memory devices), analyzes the location of a defect in a memory device if any, and determine an optimum solution as to which spare line (spare memory cell line) a defective line (memory cell column or row) of a memory device should be replaced with in order to repair the memory device. Only the essential elements of the apparatus will be described herein.

The semiconductor device test apparatus includes an engineering work station (EWS) 10, a test processor (TP) 20, and a repair analysis computing unit (RCPU) 30. Provided in the repair analysis computing unit 30 are fail memory 31 and a general-purpose repair analysis part 32. The engineering work station 10, test processor 20, and repair analysis computing unit 30 are capable of sending and receiving data, control signals, and programs between them through signal lines 15, 16, and 17. In addition, a test head 40 which electrically contacts a DUT to test the DUT is connected to the test processor 20 through a cable 18. The test head 40 provides a test signal from the test processor 20 to the DUT, receives a response signal from the DUT, and writes the result of the test in the fail memory unit 31. The general-purpose repair analysis part 32 analyzes the test result stored in the fail memory 31 to determine how a defective memory cell of the DUT should be repaired.

The engineering work station (EWS) 10, which is a computer used by a measuring person for operating the apparatus, includes a repair condition file (RCF) storage 11 and a control part 12, sends out a control signal through the signal lines 15, 16, 17 under the control of the control part 12, downloads a program, and sends and receives data. Although not shown, the engineering work station 10 also includes input means for a user to input various settings and execution commands, and a display device as a GUI (Graphical User Interface) for displaying test processes and various kinds of data.

The test processor (TP) 20, which is a computer configured specially for the semiconductor device test apparatus, includes a test program storage 21 storing a test program for testing semiconductor devices, and performs control for function tests of DUTs. The test processor 20 executes a test program stored in the test program storage 21 to generate a test address, test data, and expectation value data, provides the test address and test data to the test head 40, and writes the test data in a memory cell in a memory device on the wafer attached to the test head 40 that is specified by the test address. The test processor 20 then compares data read from the address with the expectation data to determine whether the memory cell at the address is acceptable or defective. If defective, the test processor 20 writes data indicating the defect at the corresponding address in the fail memory 31 of the repair analysis computing unit 30. This test is performed on all addresses of the memory device and the test results are provided to the fail memory 31.

The general-purpose repair analysis part (general MRA) 32 of the repair analysis computing unit 30 includes an MRA program storage 32A, a user analysis program storage 32B, a analysis control part 32C, and data storage 32D, obtains required data from the fail memory 31 storing data on the results of tests on a DUT, executes an MRA program under the control of the analysis control part 32C to perform repair analysis of defective cells, and determines the most efficient assignment of a spare line to the defective memory cells. The results of the analysis are sent to the test processor 20 for later use in physical repair of the DUT. The user analysis program storage 32B and the data storage 32D will be described with reference to FIG. 2.

Figure 2:
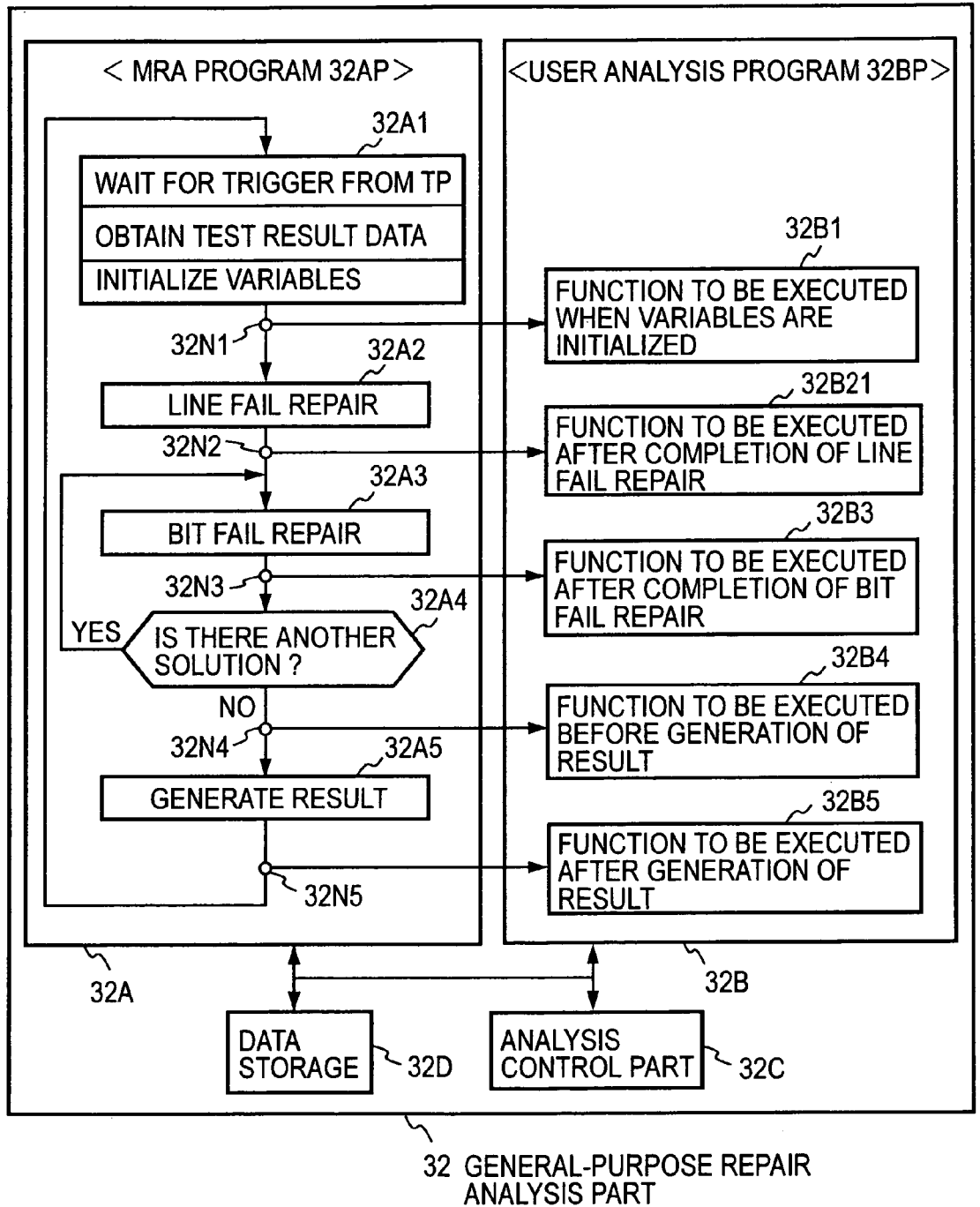
FIG. 2 is a block diagram showing a basic configuration of a general-purpose repair analysis part 32 in FIG. 1.

FIG. 2 is a block diagram showing a basic functional configuration of the general-purpose repair analysis part 32 contained in the repair analysis computing unit 30 of FIG. 1. The general-purpose repair analysis part 32, which is an essential element of the present invention, includes the MRA program storage 32A storing a memory repair analysis program 32AP, the user analysis program storage 32B storing user analysis program functions 32BP, the analysis control part 32C, and the data storage 32D, as briefly described with reference to FIG. 1. The MRA program 32AP stored in the MRA program storage 32A is not a conventional program which merely provides models for memory repair solutions. Instead, an analysis process is split into parts for individual operations, and user function insertion points 32N1-32N5 are provided in the MRA program 32AP at which user functions 32B1-32B5 from the user analysis program 32BP can be inserted, each of which performs user-specific DUT-repair-analysis at the endpoint of the operation of the part. The data storage 32D stores data necessary for execution of the MRA program, for example repair condition files, data at intermediate stages of analysis, and analysis result data.

The MRA program 32AP includes: the step 32A1 of obtaining test result data from the fail memory 31 in response to a trigger indicating the completion of a test on a DUT from the test processor 20, for example, and initializing variables used in analysis; the step 32A2 of analyzing the test result data to assign a spare line for repairing a defective memory cell line; the step 32A3 of assigning a spare line for repairing defective cells that remain after step 32A2; the step 32A4 of determining whether there is another way to assign a spare line after bit repair; and the step 32A5 of generating the results of analysis if there is not another way to assign a spare line. If another assigning way is found at step 32A4, spare line assignment is performed for bit fail repair at side step 32A3. These steps 32A1-32A5 are performed on each memory device. Information such as the memory size of the DUT, the number of blocks making up each block group, the number of row spare lines, and the number of column spare lines, is required in the line fail repair at step 32A2, the bit fail repair at step 32A3, and the determination at step 32A4. These items of information are loaded in the data storage 32D from a repair condition file RCF and used.

Splitting the analysis process in A program 32AP into parts 32 for individual operations refers to dividing the process into parts for operations such as acquisition of test result data and initialization of variables used in analysis (step 32A1), analysis of a line fail (step 32A2), analysis of a bit fail (step 32A3), and generation of the result of repair (step 32A5). Insertion points 32N1-32N5 are provided between these operations as necessary for providing and receiving user functions 32B1-32B5 so that individual user functions 32B1-32B5 making up a user-specific user analysis program 32BP can be inserted.

The user functions may include a function executed when initializing variables 32B1, a function executed after a line fail repair 32B2, a function executed after a bit fail repair 32B3, a function executed before generation of a result 32B4, and a function executed after the generation of the result 32B5. These functions are executed under the control of the analysis control part 32C. In particular, the function executed after a line fail repair checks repair addresses to see whether there is identical repair addresses, for example. The function executed after a bit fail repair also checks repair addresses to see whether there is identical repair addresses. With the checking, appropriate spare lines to be used in repair of the same address can be selected.

In this way, a user can use a user function inserted to obtain analysis data, namely repair information and fail information, at a desired phase of processing according to the MRA program and thereby can repair a DUT having a special redundancy structure. In the embodiment described with respect to FIGS. 1 and 2, the combination of the analysis control part 32C and the MRA program storage 32A constitutes memory repair analysis means that performs memory repair analysis of fail information; the combination of the analysis control part 32C and the user analysis program storage 32B constitutes user function means that inserts a user function between units of processing of an MAR program.

Figure 3:
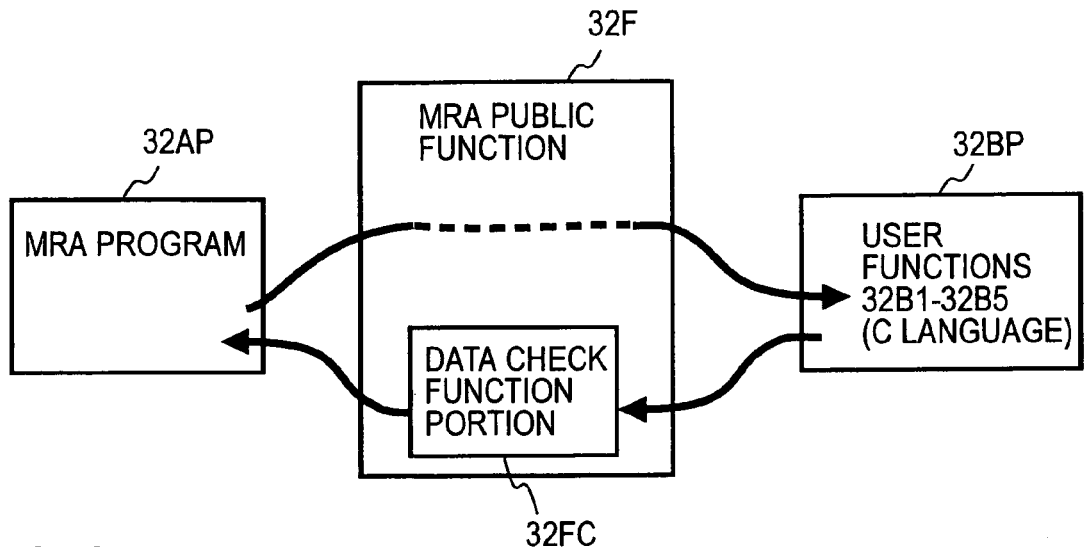
FIG. 3 is a conceptual diagram showing the relationship among an MRA program, MRA public functions, and a user analysis program.

FIG. 3 schematically shows, as a variation of the embodiment shown in FIGS. 1 and 2, the capability of exchanging information between the MRA program 32AP shown in FIG. 2 and a user function in the user analysis program 32BP through an MRA public function 32F that is directly intelligible to the user. If a user function 32B1-32B5 directly accesses the data storage 32D used by the MRA program 32AP to set data, data such as repair data could be corrupted by an incorrect value of the user function set by the user. Therefore, a function 32F called an MRA public function that acts as a filter is provided between the MRA program 32AP and the user function 32B1-32B5. By using the MRA public function 32F, a database can be referred to or modified safely within the user function 32B1-32B5. The user functions are written in C language in this embodiment.

Bearing in mind that the MRA public function 32F described with respect to FIG. 3 is frequently used by engineers at manufactures and users of semiconductor device test apparatuses, a certain set of rules is defined so that users can readily write user analysis programs. MRA public function names are specified as shown in FIG. 4 in order to allow users to approximately understand the meaning of MRA public functions from their names, to minimize stress on the users during writing user functions, and to prevent the users from having impression that they are difficult to use.

Figure 4:
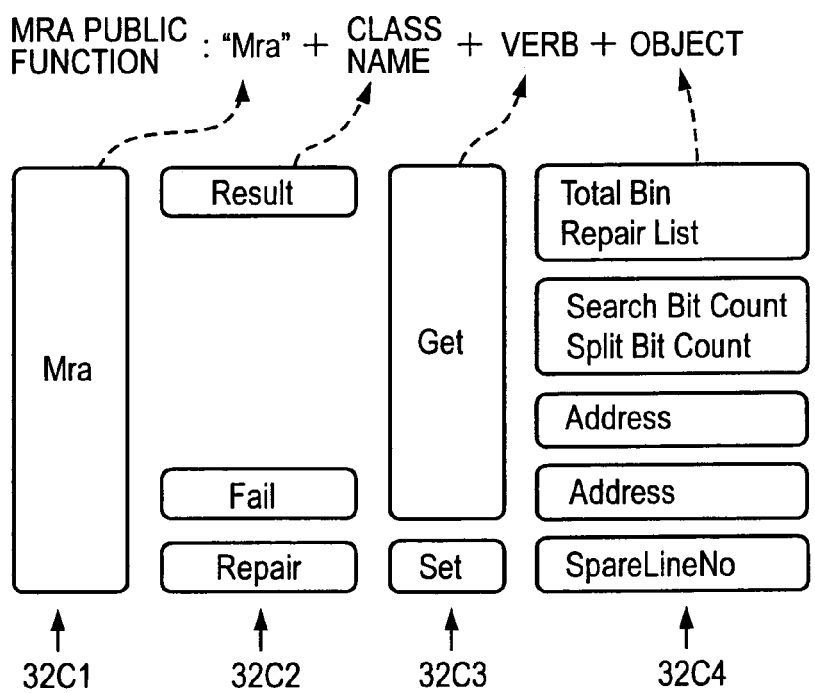
FIG. 4 is a diagram for illustrating a naming rule for MA public functions.

The MRA public function name shown in FIG. 4 is an example that is written in accordance with certain rules, which will be described below. First, a tag, "Mra", is given to all functions. Then, a "class name" is assigned that indicates what type of data is dealt with. For example, the class name "Result" may be assigned to a function that deals with analysis result information stored in the repair analysis data storage 32D, the class name "Fail" to a function that deals with failure information, and the class name "Repair" to a function that deals with repair information.

A verb that indicates what the function does is then assigned. For example, the verb "Get" may be assigned to a function that gets information and the verb "Set" to a function that sets data. Finally, an object that indicates which information the function deals with is provided. As an example, a function name like "A=MraResultGetTotalBin" may be written. Various descriptions can be used since various rules can be established for writing programs. The essential thing is that anyone can easily write functions anytime. In this embodiment, a data check function portion 32FC is further provided that checks data set by a user function to see whether the data is valid or not. The data check function portion 32FC checks set data, for example an address value, the number of spare lines, a spare group number, or a block number inputted through a user function 32B1-32B5, to see whether the data has an abnormal value, that is, whether the value is within a predetermined range. If an abnormal value is detected, a setting error is displayed on the engineering work station.

FIG. 5 shows an example of a user analysis program employing the description method shown in FIG. 4. The user analysis program 32BP is loaded from the engineering work station 10 into the user analysis program storage 32B. Lines 2 to 13 (UF1) are a user function that sorts a repair address portion; lines 14 to 29 (UF2) are a function that checks the repair addresses for the same address; lines 30 to 36 (UF3) are a main function of the user analysis program; and lines 37 to 44 (UF4) are a user setup function. Descriptions of MRA public functions can be seen on lines 8, 9, 24, and 25, for example.

For example in the MRA program 32AP shown in FIG. 2, the main function UF3 is executed at a user function insertion point 32N2. "SampleRuleCheck1" on the 30th line of the program in FIG. 5 represents a user function name. Accordingly, the check by "addressCheckRow" on line 34 is executed by the user function UF2 from line 14 to line 29. "MraPOINT_POST_REPAIR_LINEFAIL" on line 39 is the name assigned to the user function insertion point 32N2.

Line 20 in the user function UF2 uses the description method shown in FIG. 4 to represent an MRA public function, "MraBlockGroupGetRepairList". The number of block groups "blockGroupNo" and the row or column "dir" specified by the user in the list in the function indicate that the set values are checked for a predicted value when the function is performed, for example, to see whether "blockGroupNo" is less than or equal to 8 and whether "dir" is one of 1 (row) and 2 (column). If the user sets an invalid value, it is detected and an error message can be displayed. This prevents an incorrect value from being set in the data storage 32D.

Figure 6:
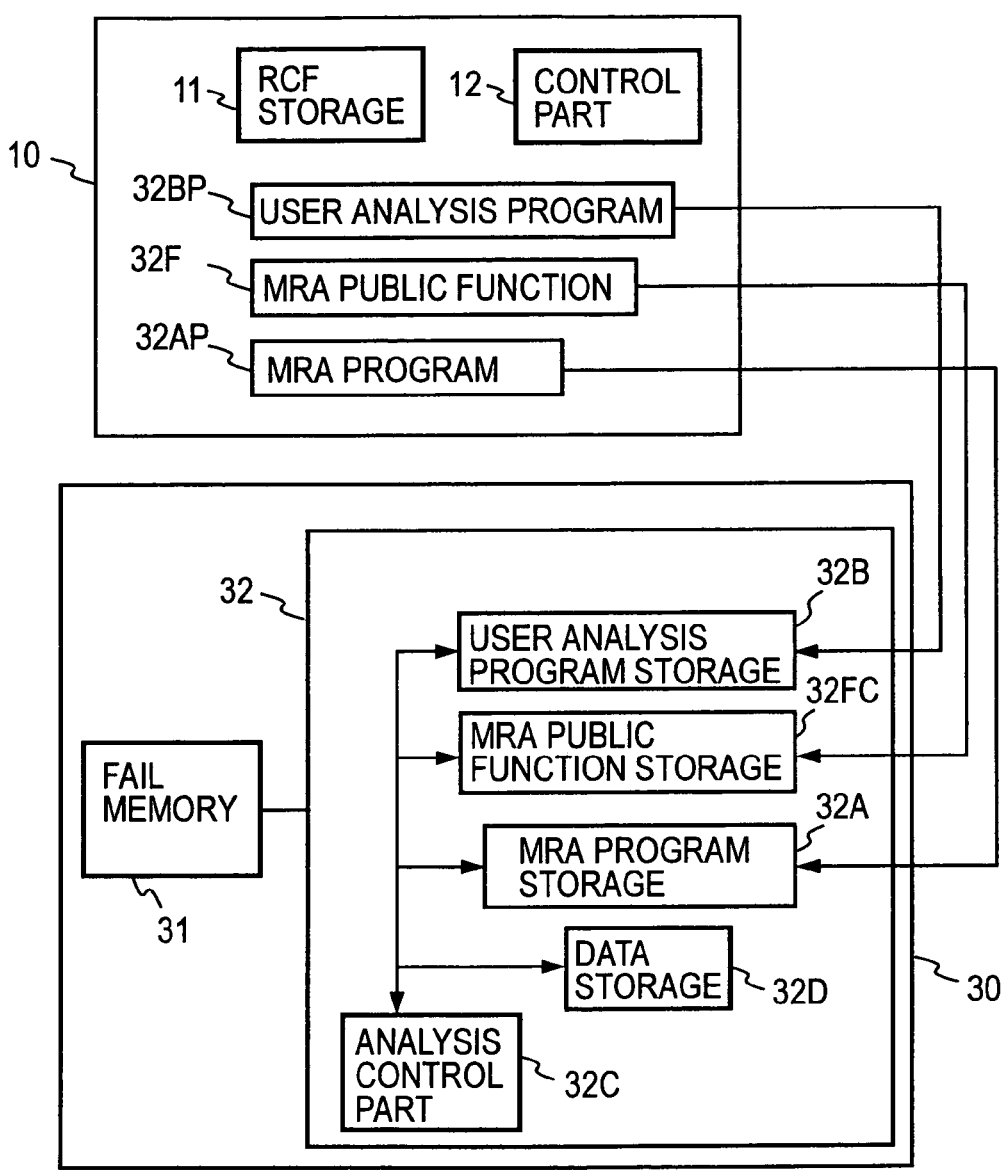
FIG. 6 is a functional block diagram showing another embodiment of the present invention.

FIG. 6 shows a configuration of an embodiment in which MRA public functions shown in FIGS. 4 and 5 are introduced. For simplicity, components such as a test processor 20 and test head 40 are not shown. In this embodiment, an MRA public function storage 23FC is provided in a general-purpose repair analysis part 32B in the configuration shown in FIG. 1. Before a test is started, an MRA program 32AP, a user analysis program 32BP, and MRA public functions 32F are loaded from an engineering work station 10 into an MRA program storage 32A, a user analysis program storage 32B, and an MRA public function storage 32FC, respectively. The combination of the analysis control part 32C and the MRA public function storage 32FC constitutes MRA public function means for inserting a user function between units of processing of the MRA program through an MRA public function.

Figure 7:
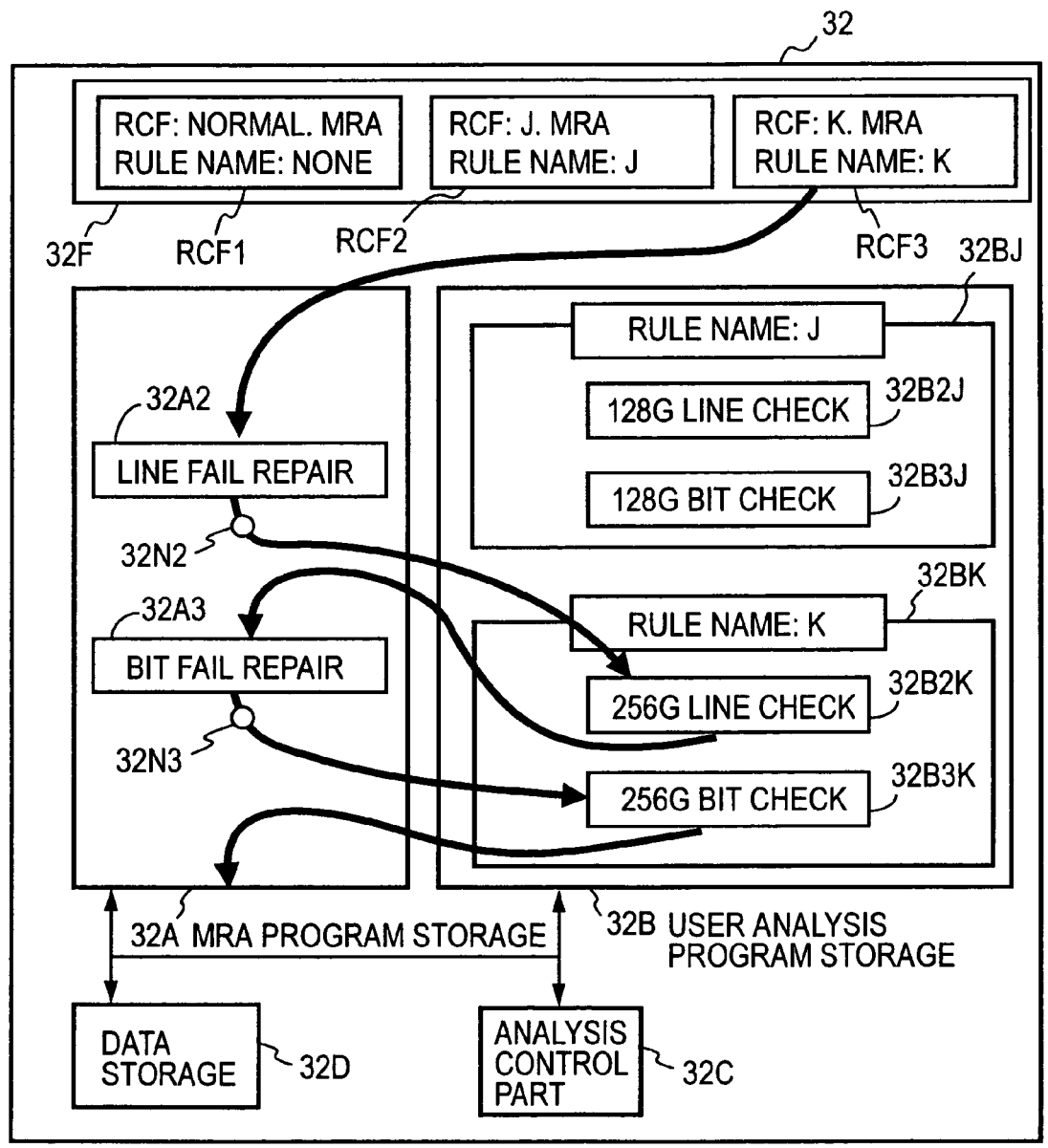
FIG. 7 is a functional block diagram showing yet another embodiment of the present invention.
Figure 8A:
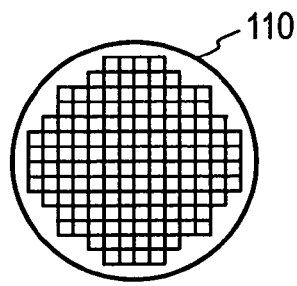
FIG. 8A shows a wafer on which semiconductor devices are formed.
Figure 8B:
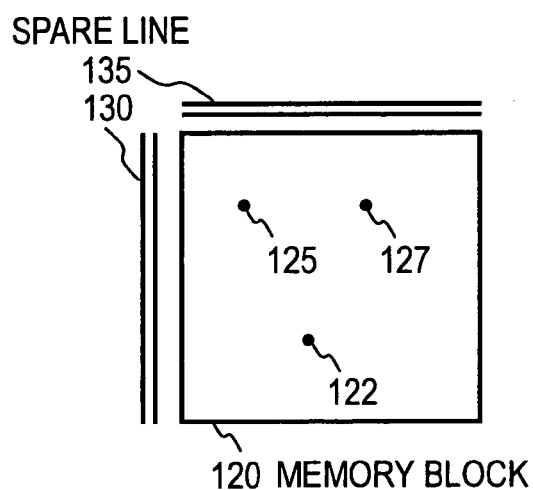
FIG. 8B shows one block in a memory device.
Figure 8C:
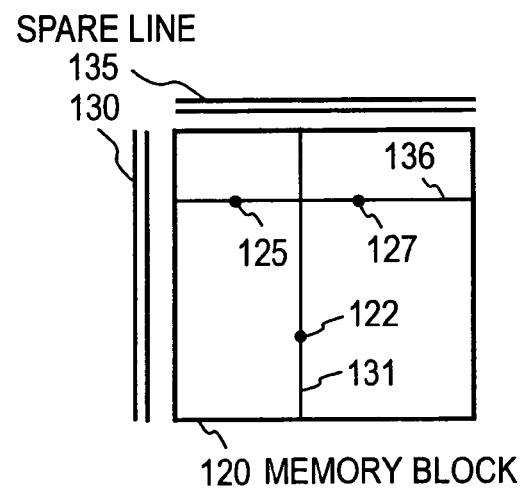
FIG. 8C is a diagram for illustrating repair of defective memory cells.
Figure 9:
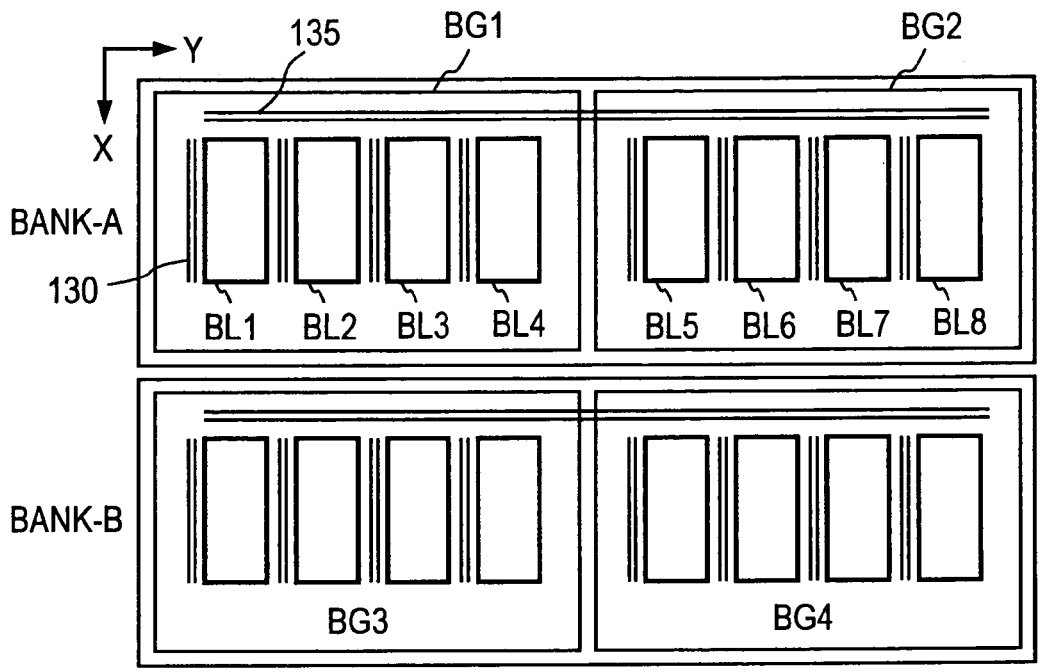
FIG. 9 shows an example of a memory device having a redundancy structure.
Figure 10:
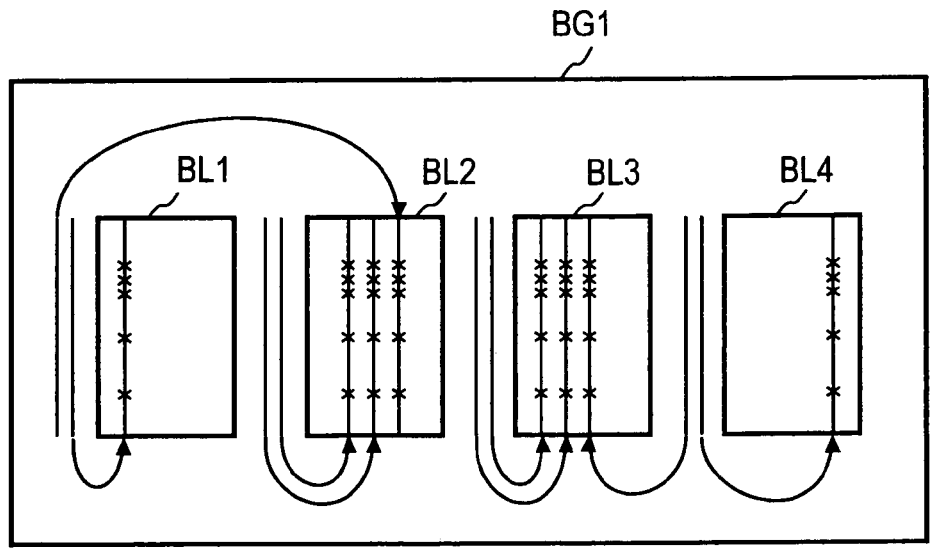
FIG. 10 is a diagram illustrating a first condition of repair of the memory device shown in FIG. 9.
Figure 11:
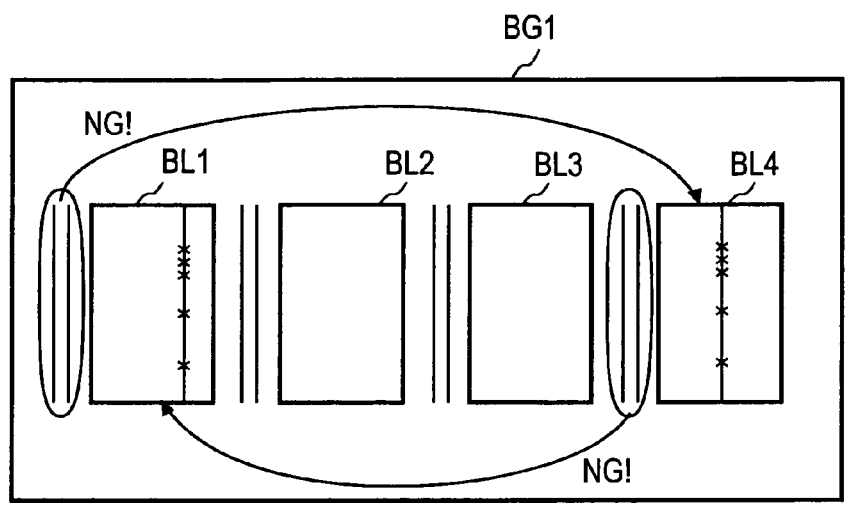
FIG. 11 is a diagram illustrating a second condition of repair of the memory device shown in FIG. 9.
Figure 12:
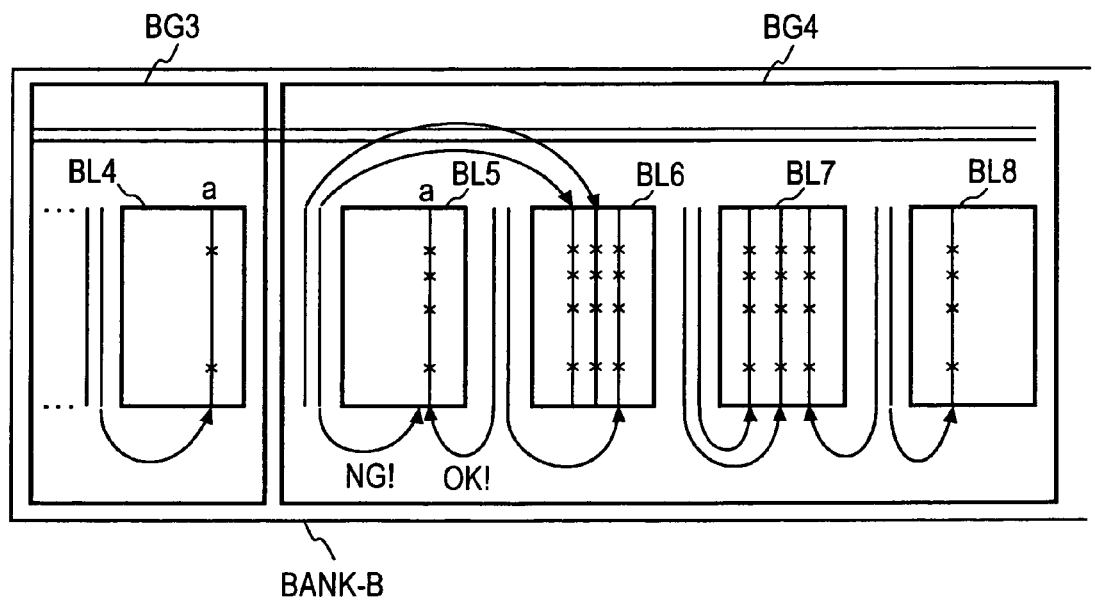
FIG. 12 is a diagram illustrating a third condition of repair of the memory device shown in FIG. 9.
Figure 13:
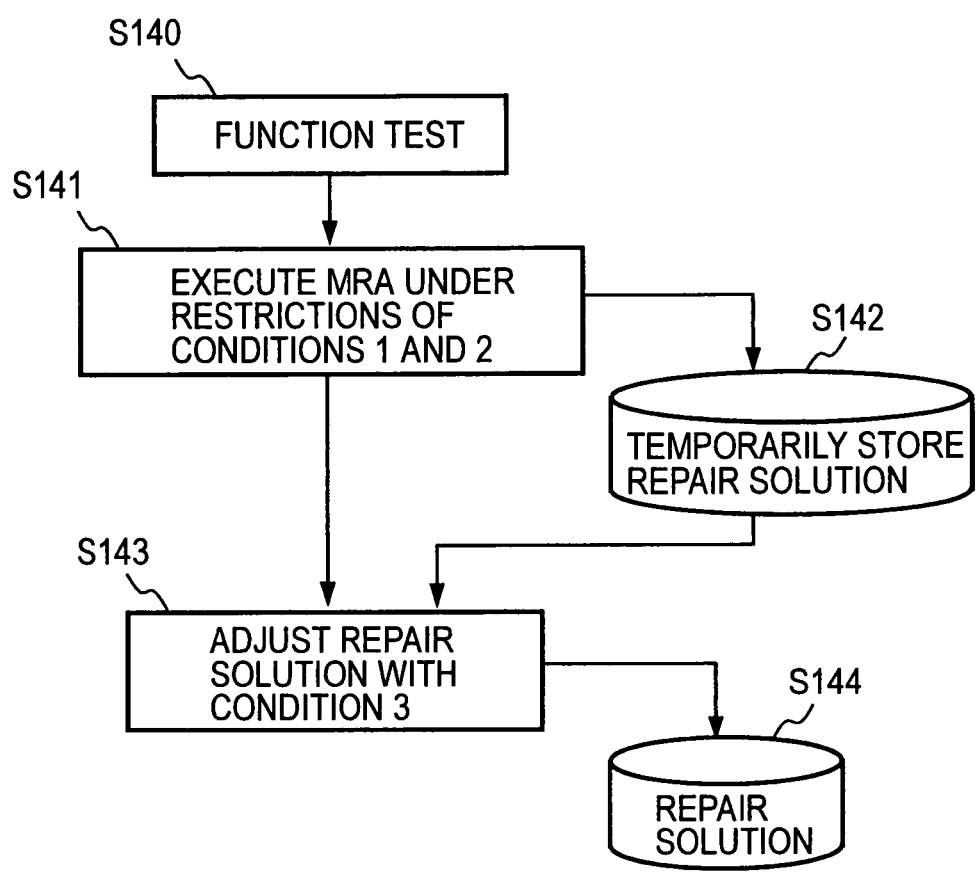
FIG. 13 is a conceptual diagram illustrating an object to solve a problem with the conventional art.

FIG. 7 shows a configuration of the general-purpose repair analysis part 32 of an embodiment in which user functions can be selected to be used for tests on different types of DUTs in the embodiment shown in FIG. 1. Different repair condition files RCFs are provided for different types of semiconductor devices. Accordingly, each time a different type of DUT is selected, the RCF corresponding to that type of DUT must be selected before an MRA program is executed. If changeover from one type of DUT to another is made frequently, it is time consuming and inefficient to load an RCF from the engineering work station 10 to the general-purpose repair analysis part 32 each time changeover is made. Therefore, sets of user functions 32BJ and 32BK that correspond to different types of DUTs are provided in a user analysis program 32BP and are stored in the user analysis program storage 32B so that the user functions 32BJ, 32BK can be readily selected in accordance with the type of DUT. Rule names "J" and "K" are assigned to the sets of user functions 32BJ and 32BK, respectively.

Further provided in the general-purpose repair analysis part 32 is an RCF storage 32F, in which a repair condition file RCF1 with the rule name "none" that is independent of the type of DUT, and repair condition files RCF2 and RCF3 with the rule names "J" and "K" that are dependent on the type of DUT are provided. The RCF with the rule name "J" is used for memory devices having a capacity of 128 Mbytes and the RCF with the rule name "K" is used for memory devices having a capacity of 256 Mbytes. Because the rule names also function as identities of DUTs, a user can easily define user functions.

The repair condition files (RCFs) are stored in the repair condition file storage 11 of the engineering work station 10 as described above and repair analysis is performed based on these files. By specifying a rule name in an RCF, user functions can be changed readily in accordance with the type of DUT at run-time.

If no rule name is specified in an RCF, the MRA program 32AP performs original repair analysis. If a rule name is specified in an RCF as shown in FIG. 7, the set of user functions 32BK specified for the rule name "K" is executed. For example, "SAMPLE_RULE_CHECK1" on lines 39 and 41 corresponds to the rule name "J" of repair condition file RCF2 (or "K" of RCF3) in the user analysis program of FIG. 5.

In this way, user functions intended for a DUT can be readily selected on a single semiconductor device test apparatus that is used for testing different types of DUTs.

EFFECTS OF THE INVENTION

As has been stated earlier, the conventional MRAs have been sufficiently effective for repair of conventional memory ICs. However, it has become difficult to repair DUTs containing memory devices having special, user-specific redundancy structures with the conventional MRAs in recent years, which has led to yield reduction.

According to the present invention, a general-purpose repair analysis part 32 is provided in which a newly provided MRA program 32AP and a user analysis program 32BP are caused to work with each other so that DUTs having special redundancy structures can be tested. As a result, the need for the on-wafer post process is eliminated. Furthermore, because user functions that represent user-specific operations can be incorporated, repair analysis can be retried until a user-specific operation is found to be able to repair.

Because the user-specific operations run on a repair analysis computing unit (RCPU) 30, a function test on a DUT by a test processor 20 can be performed in parallel with memory repair analysis by a repair analysis computing unit 30 when multiple DUTs are tested at a time. As a result, the run time can be significantly reduced.

Thus, the present invention enables near complete repair analysis of DUTs containing a semiconductor memory device and has a great technical effect.

What is claimed is:

1. A semiconductor device test apparatus comprising:
a test processor which applies a test signal to a semiconductor memory device under test and obtains information about defective memory cells from a response signal; and
a repair analysis computing unit which performs repair analysis of the defective memory cell information to determine whether the defective memory cells are repairable;
wherein the repair analysis computing unit comprises:
a general-purpose repair analysis part; and a fail memory storing the defective memory cell information;

and wherein the general-purpose repair analysis part comprises:

(1) a memory repair analysis program storage storing a general-purpose memory repair analysis program which is designed to perform, based on regular repair conditions, repair analysis of the defective memory cell information for regular type memory devices that have no specific redundancy structure and have said regular repair conditions, said memory repair analysis program comprising operations constituting a process of the repair analysis for the regular type memory devices and including user function insertion points between the individual operations;

(2) a user analysis program storage storing a user analysis program which is designed to perform, based on specific repair conditions, repair analysis of the defective memory cell information for a specific type memory device other than the regular type memory devices that has a specific redundancy structure and has the specific repair conditions, said user analysis program comprising user functions that are to be inserted to the user function insertion points of the memory repair analysis pro gram to obtain analysis data from the respective user function insertion points and to make a change to the thus obtained analysis data so as to perform the repair analysis based on the specific repair conditions;

(3) a data storage storing data necessary for executing the memory repair analysis program; and (4) an analysis control part, wherein the analysis control part comprises:

(a) means for performing, when a regular type memory device is subjected to repair analysis, repair analysis for the regular type memory device in accordance with the memory repair analysis program based on the regular repair conditions, and (b) means for performing, when the specific type memory device is subjected to repair analysis, repair analysis for the specific type memory device in accordance with the memory repair analysis program based on the regular repair conditions, and the user functions of the user analysis program which are inserted to the user function insertion points of the memory repair analysis program based on the specific repair conditions.

2. The semiconductor device test apparatus according to claim 1, wherein the general-purpose repair analysis part further comprises memory repair analysis public function storage that stores a memory repair analysis public function for inserting the user functions to the user function insertion points through intervention of the memory repair analysis public function.

3. The semiconductor device test apparatus according to claim 2, wherein the memory repair analysis public function has a data check function portion which checks whether data set by the user function is proper.

4. The semiconductor device test apparatus according to claim 1, wherein the general-purpose repair analysis part further comprises a repair condition file storage storing a plurality of repair condition files that define different repair conditions for different types of memory devices;

the user analysis program storage stores as the user analysis program a plurality of sets of user functions, said sets of user functions being corresponding to respective repair condition files; and the analysis control part comprises means for selecting a set of user functions on the basis of a repair condition file that matches the type of the memory device under test and inserting respective user functions of the selected set to the user function insertion points of the memory repair analysis program.

5. A semiconductor device test method comprising the steps of:

(a) performing a function test on a specific type memory device under test that has a specific redundancy structure and has specific repair conditions to obtain information about defective memory cells;

(b) preparing a general-purpose memory repair analysis program that is designed to perform memory repair analysis for a regular type memory device having no specific redundancy structure and having regular repair conditions other than the specific repair conditions, which comprises individual operations constituting a process of the repair analysis, and which includes user function insertion points between the operations;

(c) preparing a user analysis program which is designed to perform the specific repair conditions of the specific type memory device and comprises user functions that are to be inserted to user function insertion points to make a change to data processed by the memory repair analysis program based on the specific repair analysis conditions; and (d) performing repair analysis of the defective memory cell information of the specific type memory device in accordance with the general-purpose memory repair analysis program by inserting the user functions to the user function insertion points.

6. The semiconductor device test method according to claim 5, wherein the step (d) comprises inserting the user function to the user function insertion points of the memory repair analysis program through intervention of a memory repair analysis public function.

7. The semiconductor device test method according to claim 6, wherein the memory repair analysis public function comprises the step of executing a data check function which checks whether data set by the user function is proper.

8. The semiconductor device test method according to claim 5, wherein the memory repair analysis program comprises performing line fail repair processing and performing bit repair processing; and step (d) comprises:

making a change to the result of the line fail repair processing through the user function after the step of performing the line fail repair processing and making a change to the result of the bit repair processing through the user function after the step of performing the bit repair processing.

9. The semiconductor device test method according to claim 5, wherein step (d) comprises selecting a set of user functions that corresponds to the type of the memory device under test from among a plurality of sets of user functions provided correspondingly to a plurality of repair conditions predetermined for the types of memory devices; and inserting the user functions of the selected set to the user function insertion points.

10. The semiconductor device test apparatus according to claim 1, wherein:
  said memory repair analysis program comprises the operations of:
    acquisition of test result data and initialization of variables used in analysis;
    analysis of a line fail;
    analysis of a bit fail;
    determination whether any other assignment of spare line; and
    generation of the result of repair; and
  said respective operations constitute a process of the repair analysis for the regular type memory devices and have user function insertion points there between for inserting the user functions of the user analysis program.

11. The semiconductor device test apparatus according to claim 1, wherein:
  said user analysis program comprises:
    a function executed when initializing variables;
    a function executed after a line fail repair
    a function executed after a bit fail repair;
    a function executed before generation of a result; and
    a function executed after the generation of the result; and
  said respective user functions are designed to perform the repair analysis for the specific type memory device based on the specific repair conditions which the memory repair analysis program cannot perform.

12. The semiconductor device test method according to claim 5, wherein:
  said memory repair analysis program comprises the operations of:
    acquisition of test result data and initialization of variables used in analysis;
    analysis of a line fail;
    analysis of a bit fail;
    determination whether any other assignment of spare line; and
    generation of the result of repair; and
  said respective operations constitute a process of the repair analysis for the regular type memory devices and have user function insertion points there between for inserting the user functions of the user analysis program.

13. The semiconductor device test method according to claim 5, wherein:
  said user analysis program comprises:
    a function executed when initializing variables;
    a function executed after a line fail repair
    a function executed after a bit fail repair;
    a function executed before generation of a result; and
    a function executed after the generation of the result; and
  said respective user functions are designed to perform the repair analysis for the specific type memory device based on the specific repair conditions which the memory repair analysis program cannot perform.

* * * * *